United States Patent [19]

Ho et al.

[11] Patent Number: 4,680,854
[45] Date of Patent: Jul. 21, 1987

[54] FORMING LOW RESISTIVITY HILLOCK FREE CONDUCTORS IN VLSI DEVICES

[75] Inventors: Vu Q. Ho, Kanata; Heinz J. Nentwich, Ottawa, both of Canada; Hussein M. Naquib, Fremont, Calif.

[73] Assignee: Northern Telecom Limited, Montreal, Canada

[21] Appl. No.: 812,993

[22] Filed: Dec. 24, 1985

[51] Int. Cl.⁴ ............... H01L 21/263; H01L 21/388
[52] U.S. Cl. ........................... 29/576 B; 29/590; 29/591; 148/1.5; 148/187; 148/DIG. 140
[58] Field of Search ............ 29/576 B, 590, 591; 148/1.5, 187

[56] References Cited

U.S. PATENT DOCUMENTS

| | | | |
|---|---|---|---|
| 3,903,324 | 9/1975 | Gukelberger, Jr. et al. | 29/576 B |
| 4,482,394 | 11/1984 | Heinecke | 148/1.5 |
| 4,502,206 | 3/1985 | Schnable et al. | 29/576 B |
| 4,507,852 | 4/1985 | Karulkar | 29/590 |
| 4,520,554 | 6/1985 | Fisher | 29/591 |
| 4,536,223 | 8/1985 | Faith, Jr. | 148/1.5 |
| 4,569,124 | 2/1986 | Rensch | 29/591 |

OTHER PUBLICATIONS

Kamei et al., IEDM Tech. Digest (1984), pp. 138–141.
Hung et al., Appl. Phys. Letts., 43 (1983), 1123.
Whitlow et al., J. Appl. Phys., 58 (1985), 3246.
Cadien et al., J. Vac. Sci. Technol., B-2 (1984), 82.

Primary Examiner—Upendra Roy
Attorney, Agent, or Firm—Schwartz, Jeffery, Schwaab, Mack, Blumenthal & Evans

[57] ABSTRACT

Particularly for use in MOS (metal-oxide-semiconductor) VLSI (very large scale integrated) circuits, an aluminum conductor coated with a layer of refractory metal or refractory metal silicide has the advantages of being resistant both to electromigration and to hillock growth. By this invention, to reduce the resistivity of this composite conductor and to eliminate hillock formation, the conductor is subjected to an ion implantation step to cause interface mixing between the aluminum and the adjacent refractory metal or refractory metal silicide.

6 Claims, 4 Drawing Figures

FORMING LOW RESISTIVITY HILLOCK FREE CONDUCTORS IN VLSI DEVICES

BACKGROUND OF THE INVENTION

This invention relates to a method for fabricating conductors in very large scale integrated (VLSI) circuits and to conductors obtained using the method.

It is known that electromigration and hillock formation within aluminum conductors can seriously reduce VLSI device yield since these features cause device failures. Electromigration is caused by aluminum atom transfer at the grain boundary or at surface regions of the aluminum conductor due to high density electron flow. It can result in open circuit. Hillock growth is caused by the difference in thermal expansion coefficients between the aluminum and underlying silicon dioxide. It is known to add copper to the aluminum to improve electromigration resistance and reduce hillock growth. However, aluminum-copper films are difficult to plasma etch because copper compounds have low vapour pressure. Also hillocks are still not completely eliminated.

Recently it has been found that aluminum-silicon coated by a refractory metal or refractory metal silicide layer shows an appreciable improvement in electromigration resistance and suppression of hillock growth (D. S. Gardner et al, 1984, Proceedings of IEEE, VLSI Multilevel Interconnection Conference, June 21–22, New Orleans, page 68 and Shima et al, Ibid, page 61). However, the resistivity of this composite conductor is increased and its dry etching is difficult because of the existence of a native aluminum oxide at the interface between the aluminum-silicon alloy and the refractory metal or refractory metal silicide layer.

SUMMARY OF THE INVENTION

To overcome this problem and to eliminate hillock formation, a method according to the present invention proposes the implantation of ions through the refractory metal or refractory metal silicide layer to promote interface mixing at the interface of that layer with the aluminum film. The implanted ions should have heavy mass number. Suitable ions are those of arsenic, germanium or boron difloruide.

BRIEF DESCRIPTION OF THE DRAWINGS

An embodiment of the invention will now be described by way of example with reference to the accompanying drawings in which.

DETAILED DESCRIPTION OF THE PREFERRED EMBODIMENTS

Figure 1:
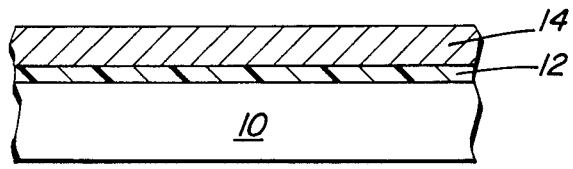
FIGS. 1 to 4 show sectional views of a part of a silicon chip during processing thereof to form conductors thereon.
Figure 2:
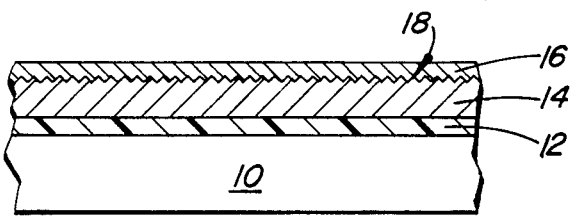

Referring in detail to FIG. 1 there is shown part of a wafer having a silicon substrate 10 on which a 1 micron thick layer 12 of field oxide is thermally grown. A 1 micron thick layer 14 of aluminum-silicon alloy having 99 percent aluminum and 1 percent silicon is deposited on the oxide layer by DC magnetron sputtering. A thin layer 16 of the order of 500 Angstrom units of titanium or titanium silicide is subsequently deposited by DC magnetron sputtering (FIG. 2).

Although the refractory metal or refractory metal silicide has a higher resistivity than aluminum, its presence inhibits electromigration and hillock formation in the aluminum. However, as is well known, a native oxide 18 forms over the aluminum-silicon layer which appreciably increases the resistance of the composite conductor.

Figure 3:
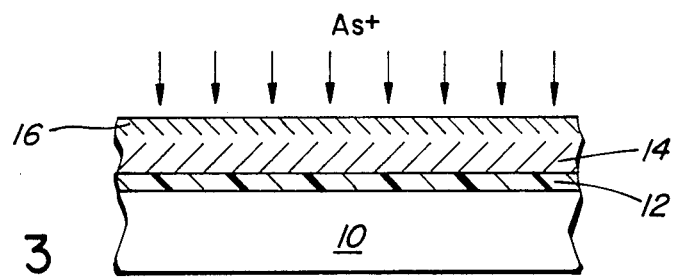

To remove this high resistivity film after deposition of the refractory metal or refractory metal silicide, the composite conductor is subjected to ion implantation (FIG. 3). Arsenic ions with an energy of 100 keV and a dose in the range of $10^{15}$ to $10^{16}$ ions per cm$^2$ are directed at the chip. The implant energy is selected to implant arsenic ions through the refractory metal or refractory metal silicide layers so that the ions achieve destruction of aluminum-oxide bands and interdiffusion or interface mixing where the silicide or refractory metal overlies the aluminum-silicon layer. Ions are implanted prior to patterning the composite aluminum conductor so that no arsenic ion implantation occurs in other areas of the device. Arsenic ion implantation is confined to the top 1000 Angstrom units of the composite aluminum conductor.

Figure 4:
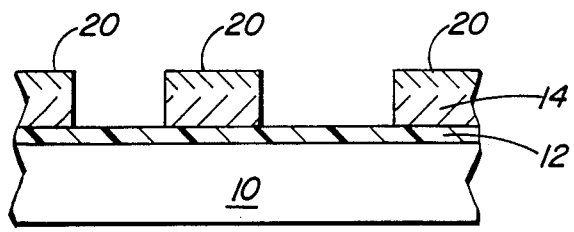

After ion implantation and interface mixing, the conducting layer is patterned using a carbon tetrachloride or boron trichloride plasma (FIG. 4) to define conducting regions extending between bonding pads associated with active devices implemented in the wafer and other bonding pads associated with terminals of the integrated circuit chip.

Subsequently, the device is annealed in hydrogen at 450° C. to remove implantation damage and the conducting regions and other parts of the wafer are coated with a 1 micron thick protective layer of phosphosilicate glass (PSG). The hydrogen diffuses rapidly to the silicon/oxide interface and forms silicon-hydrogen bonds from silicon dangling bonds generated during deposition of aluminum by sputtering or electron beam evaporation.

Alternatively the device is annealed using a transient isothermal pulse annealing step at a temperature of 500° C. for 10 seconds. The use of transient annealing appears to further supress hillock formation.

Although the specific example relates to a silicide on aluminum composite conductor, the invention may be used to reduce resistivity of composite conductors containing aluminum alloys such as Al–Si (0.5–1%), Al–Si (0.5–1%)-Cu(0.5–4%) an Al–Cu (0.5–4%).

Although the specific embodiment described uses arsenic ions, in certain circumstances, other ions of relatively high mass number for example, those of silicon, germanium, argon, xenon, crypton, boron difluoride, phosphorus and molybdenum may alternatively be used.

Although the embodiment described is in the context of a titanium metal silicide layer, it will be recognized that other refractory metal silicides such as molybdenum silicide, tungsten silicide or tantalum silicide can also be used and indeed refractory metals themselves such as titanium, molybdenum, tungsten and tantalum can be used as the upper conductor layer.

What is claimed is:

1. In a method of semiconductor processing, fabricating a conductor by:
  depositing on a semiconductor wafer a first layer of aluminum or an aluminum-rich alloy;
  depositing on the aluminum a second layer of refractory metal or refractory metal silicide; and
  causing interface mixing at an interface between the two layers by implanting ions at said interface.

2. A method as claimed in claim 1 in which the first layer comprises an alloy of aluminum.

3. A method as claimed in claim 1 in which the implanted ions are ions of one of the group of elements consisting of arsenic, phosphorus and boron difluoride.

4. A method as claimed in claim 1 in which the implanted ions are inert ions of one of the group of elements consisting of argon, xenon, krypton and germanium.

5. A method as claimed in claim 1 further comprising annealing to repair implantation damage.

6. A method of producing a low resistivity hillock free conductor in a VLSI device, comprising:
depositing a first layer of a material including aluminum on a conductor wafer;
suppressing the formation of hillocks in said aluminum by depositing a second layer of material including a refractory metal on said first layer; and
causing an interface mixing at an interface between the first and second layers in order to reduce the resistivity of the conductor by implanting ions at said interface.

* * * * *